United States Patent
Zhang et al.

(10) Patent No.: US 11,255,937 B2
(45) Date of Patent: Feb. 22, 2022

(54) K-SPACE DATA ACQUISITION DEVICE AND METHOD, AND MAGNETIC RESONANCE IMAGING DEVICE AND METHOD

(71) Applicant: Siemens Healthcare GmbH, Erlangen (DE)

(72) Inventors: Qiong Zhang, Shenzhen (CN); Wei Liu, Shenzhen (CN); Nan Xiao, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/858,031

(22) Filed: Apr. 24, 2020

(65) Prior Publication Data

US 2020/0341087 A1    Oct. 29, 2020

(30) Foreign Application Priority Data

Apr. 24, 2019  (CN) .......................... 201910334791.4

(51) Int. Cl.
*G01R 33/48* (2006.01)
*G01R 33/561* (2006.01)

(52) U.S. Cl.
CPC ..... *G01R 33/4824* (2013.01); *G01R 33/4828* (2013.01); *G01R 33/5611* (2013.01)

(58) Field of Classification Search
CPC ............ G01R 33/4824; G01R 33/4828; G01R 33/5611; G01R 33/4818; G01R 33/5607; G01R 33/56; A61B 5/055
See application file for complete search history.

(56) References Cited

U.S. PATENT DOCUMENTS

| 8,436,611 B2 * | 5/2013 | Kitane | G01R 33/4828 324/307 |
| 9,572,514 B2 * | 2/2017 | Wang | G01R 33/4824 |
| 2008/0238421 A1 * | 10/2008 | Kitane | G01R 33/56 324/307 |
| 2010/0249574 A1 * | 9/2010 | Miyazaki | A61B 5/7285 600/413 |
| 2019/0004136 A1 * | 1/2019 | Umeda | G01R 33/50 |

OTHER PUBLICATIONS

Breuer, Felix A. et al. "Controlled Aliasing in Parallel Imaging Results in Higher Acceleration (CAIPIRINHA) for Multi-Slice Imaging" Magnetic Resonance in Medicine, vol. 53, No. 3, pp. 684-691, 2005 // DOI: 10.1002/mrm.20401.

* cited by examiner

*Primary Examiner* — Susan S Lee
(74) *Attorney, Agent, or Firm* — Schiff Hardin LLP (57) ABSTRACT

A k-space data acquisition device and method, and a magnetic resonance imaging device and method. The k-space data acquisition device includes an acquisition trajectory determiner configured to determine an acquisition trajectory of echo signals in a k space in a manner of filling echo data in a pseudo radial order; and a data acquirer configured to acquire k-space data conforming to the acquisition trajectory and fill the k space.

7 Claims, 6 Drawing Sheets

S52: Determining acquisition trajectory of echo signals in k space in manner of filling echo data in pseudo radial order S54: Acquiring k-space data conforming to acquisition trajectory and filling k space S56: Reconstructing magnetic resonance image by using data in k space

| 12 | 12 | 12 | 12 | 12 | 12 | 12 | 12 | | |
|----|----|----|----|----|----|----|----|---|---|
| 12 | 8  | 8  | 8  | 8  | 8  | 8  | 8  | 8 | 9 |
| 11 | 8  | 5  | 5  | 5  | 5  | 5  | 5  | 5 | 9 |
| 11 | 7  | 4  | 2  | 2  | 3  | 3  | 3  | 5 | 9 |
| 11 | 7  | 4  | 2  | 1  | 1  | 1  | 3  | 5 | 9 |
| 11 | 7  | 4  | 2  | 1  | 1  | 1  | 3  | 6 | 9 |
| 11 | 7  | 4  | 2  | 1  | 1  | 1  | 3  | 6 | 9 |
| 11 | 7  | 4  | 2  | 2  | 2  | 2  | 3  | 6 | 9 |
| 11 | 7  | 4  | 4  | 4  | 4  | 3  | 3  | 6 | 9 |
| 11 | 7  | 7  | 7  | 6  | 6  | 6  | 6  | 6 | 9 |
| 11 | 10 | 10 | 10 | 10 | 10 | 10 | 10 | 10| 10|

K-SPACE DATA ACQUISITION DEVICE AND METHOD, AND MAGNETIC RESONANCE IMAGING DEVICE AND METHOD

TECHNICAL FIELD

The present disclosure relates to the technical field of magnetic resonance imaging, and in particular to a k-space data acquisition device and method, and a magnetic resonance imaging device and method.

BACKGROUND ART

Magnetic resonance imaging (MRI) is a technique using magnetic resonance phenomena for imaging. The principle of magnetic resonance imaging mainly comprises: nuclei containing an odd number of proton(s), for example, hydrogen nuclei widely existing in a human body, the protons thereof are in a spin motion, like small magnets, and the small magnets have irregular axes of spin. If an external magnetic field is applied, the small magnets will be rearranged according to magnetic force lines of the external magnetic field, and are specifically arranged in two directions, i.e. directions parallel to and anti-parallel to the magnetic force lines of the external magnetic field. The direction parallel to the magnetic force lines of the external magnetic field mentioned above is referred to as a positive longitudinal axis, and the direction anti-parallel to the magnetic force lines of the external magnetic field mentioned above is referred to as a negative longitudinal axis. The nuclei only have a longitudinal magnetization component that has both direction and amplitude. Nuclei in the external magnetic field are excited by radio frequency (RF) pulses at a specific frequency such that the axes of spin of the nuclei deviate from the positive longitudinal axis or the negative longitudinal axis so as to produce resonance, which is the magnetic resonance phenomenon. After the axes of spin of the excited nuclei mentioned above deviate from the positive longitudinal axis or the negative longitudinal axis, the nuclei have a transverse magnetization component.

After stopping transmitting radio frequency pulses, the excited nuclei transmit echo signals gradually release the absorbed energy in the form of electromagnetic waves, and have both the phase and energy level thereof being restored to the state before being excited, and the echo signals transmitted by the nuclei are subjected to further processing such as space encoding such that the image can be reconstructed. The above process of the excited nuclei being restored to the state before being excited is referred to as a relaxation process, and the time required to restore to an equilibrium state is referred to as a relaxation time.

Because the hydrogen nuclei in fat inside a human body and the hydrogen nuclei in water are in different molecular environments, when they are excited by the same radio frequency pulse, their resonance frequencies are different and their relaxation times are also different. When signals are acquired at different echo times, fat tissues and water show different phases and signal strengths. In order to obtain a clear image with good image contrast, there are various fat saturation methods at present that suppress signals from the fat of a subject (fat signals for short) as unwanted signals.

Figure 1:
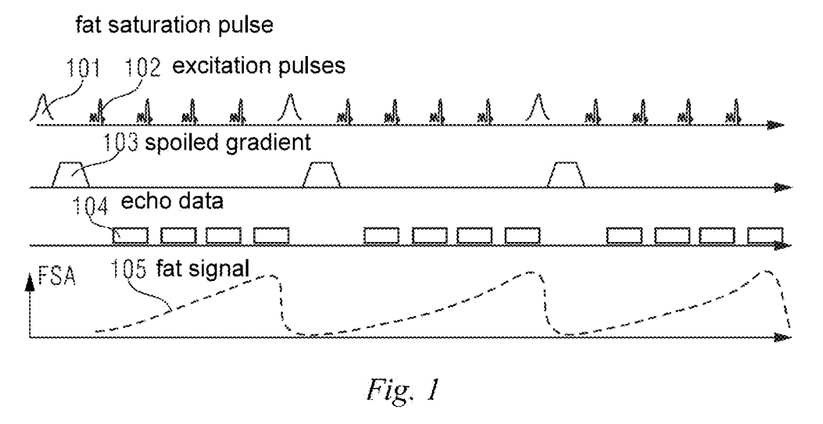
FIG. 1 is a schematic diagram of existing echo data acquisition based on quick fat saturation.

FIG. 1 shows a schematic diagram of echo data acquisition based on quick fat saturation. As shown in FIG. 1, in a first layer, a fat saturation pulse 101 is first applied to suppress a fat signal, and then a series of excitation pulses 102, that is, an RF pulse train, is applied before the fat signal is suppressed and fully recovered, wherein for easy understanding, only 4 excitation pulses are shown in the figure, and in practical applications, the number of excitation pulses can be determined according to actual situations; a second layer is a spoiled gradient 103; a third layer is echo data 104, wherein the number of echo data is consistent with the number of excitation pulses, and each piece of echo data is a read-out acquired echo signal; and a fourth layer is a fat signal 105, with its vertical axis being a fat signal amplitude (FSA), and hence, after each application of the fat saturation pulse, the fat signal suppressed to zero will be slowly recovered. The degree of recovery of the fat signal, that is, the magnitude of the fat signal depends on an elapsed period of time from the application of the fat saturation pulse.

However, since the above fat signal is recovered slowly after being suppressed, and the application of more fat saturation pulses also means more time consumption, the problem of how to balance the scanning time and the image contrast has been faced at present.

SUMMARY

In view of this, embodiments of the present disclosure propose a k-space data acquisition device and method on the one hand, and a magnetic resonance imaging device and method on the other hand, to improve the image contrast without increasing fat saturation pulses.

The k-space data acquisition device proposed in an embodiment of the present disclosure comprises: an acquisition trajectory determination module configured to divide a k space into N segments from a center origin in a spiral outward direction according to the number N of excitation pulse trains applied after each fat saturation pulse, and determine, according to the order of filling N pieces of echo data acquired sequentially corresponding to the excitation pulse trains after each fat saturation pulse into a corresponding position in each of the N segments in sequence, an acquisition trajectory of echo signals in the k space, wherein N is a positive integer; and a data acquisition module configured to acquire k-space data conforming to the acquisition trajectory and fill the k space.

In one embodiment, the data acquisition module acquires, based on a parallel imaging magnetic resonance imaging system, the k-space data conforming to the acquisition trajectory and fills the k space.

The magnetic resonance imaging device proposed in an embodiment of the present disclosure comprises: the k-space data acquisition device of any one of the embodiments above, and an image reconstruction module configured to reconstruct a magnetic resonance image by using the data in the k space.

The k-space data acquisition method proposed in an embodiment of the present disclosure comprises: dividing a k space into N segments from a center origin in a spiral outward direction according to the number N of excitation pulse trains applied after each fat saturation pulse, wherein N is a positive integer; determining, according to the order of filling N pieces of echo data acquired sequentially corresponding to the excitation pulse trains after each fat saturation pulse into a corresponding position in each of the N segments in sequence, an acquisition trajectory of echo signals in the k space; and acquiring k-space data conforming to the acquisition trajectory and filling the k space.

In one embodiment, said acquiring k-space data conforming to the acquisition trajectory and filling the k space is: acquiring, based on a parallel imaging magnetic resonance imaging system, the k-space data conforming to the acquisition trajectory and filling the k space.

The magnetic resonance imaging method proposed in an embodiment of the present disclosure comprises: dividing a k space into N segments from a center origin in a spiral outward direction according to the number N of excitation pulse trains applied after each fat saturation pulse, wherein N is a positive integer; determining, according to the order of filling N pieces of echo data acquired sequentially corresponding to the excitation pulse trains after each fat saturation pulse into a corresponding position in each of the N segments in sequence, an acquisition trajectory of echo signals in the k space; acquiring k-space data conforming to the acquisition trajectory and filling the k space; and reconstructing a magnetic resonance image by using the data in the k space.

In one embodiment, said acquiring k-space data conforming to the acquisition trajectory and filling the k space is: acquiring, based on a parallel imaging magnetic resonance imaging system, the k-space data conforming to the acquisition trajectory and filling the k space.

It can be seen from the above solution that, in the embodiments of the present disclosure, by dividing the k space into N segments from the center origin in the spiral outward direction according to the number N of excitation pulse trains applied after each fat saturation pulse, and determining, according to the order of filling N pieces of echo data acquired sequentially corresponding to the excitation pulse trains after each fat saturation pulse into a corresponding position in each of the N segments in sequence, an acquisition trajectory of echo signals in the k space, so as to realize the acquisition of k-space data in a pseudo radial filling mode, the echo data with the lowest fat signal are in the central area that can play a key role in image contrast, thereby improving the suppression effect of fat signals without increasing fat saturation pulses, and then improving the image contrast.

Further, the filling in the pseudo radial order can also be combined with parallel imaging for acquisition of k-space data, without producing significant negative effects on the image.

BRIEF DESCRIPTION OF THE DRAWINGS

The above and other features and advantages of the present disclosure will be more apparent to those of ordinary skill in the art from the detailed description of preferred embodiments of the present disclosure with reference to the accompanying drawings, in which.

In the features, reference numerals are as follows:

| Reference numerals | Meaning |
|---|---|
| 101 | Fat saturation pulse |
| 102 | Excitation pulse |
| 103 | Spoiled gradient |
| 104 | Echo data |
| 105 | Fat signal |
| 301 | Acquisition trajectory determination module |
| 302 | Data acquisition module |
| 303 | Image reconstruction module |
| S52, S54, S56 | Steps |

DETAILED DESCRIPTION

MRI imaging includes images of various cross sections in a desired direction. A k space is a data space of each cross section, that is, k-space data represents a group of original data that can form an image. For example, after echo data of a k space are acquired by using a three-dimensional fast gradient echo sequence, the echo data are filled into a phase-encoded k space. Then, a desired image can be obtained by performing a Fourier transform on the k-space data.

Figure 2A:
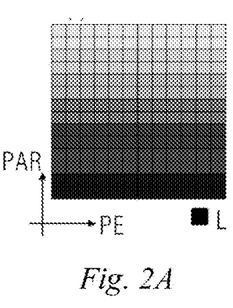
FIGS. 2A to 2D show distributions of echo signals in different k-space filling modes.
Figure 2B:
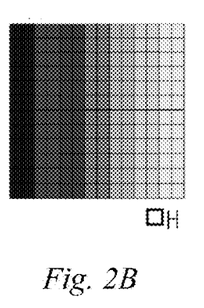
Figure 2C:
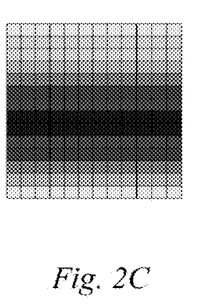

The embodiments of the present disclosure consider that the existing k space is mainly filled by using three filling modes of FIGS. 2A to 2C, wherein FIGS. 2A and 2B are linear filling, and FIG. 2C is pseudo middle order filling. As shown in FIGS. 2A to 2C, the dark area is echo data with low fat signals L, and the light area is echo data with high fat signals H. The horizontal coordinates are phase codes PE in a phase encoding direction, and the longitudinal coordinates are phase codes in a layer selection direction. It can be seen that a filling order from bottom to top is used in FIG. 2A, a filling order from left to right is used in FIG. 2B, and a filling order from the center to the upper and lower sides is used in FIG. 2C. For the filling order in FIG. 2A, the echo data with the lowest fat signal are on the lower part of the k space; for the filling order in FIG. 2B, the echo data with the lowest fat signal are on the left of the k space; and for the filling order in FIG. 2C, the echo data with the lowest fat signal are in the center bar in the up-down direction of the k space.

Figure 2D:
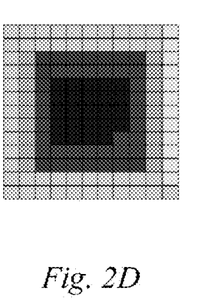

The inventors of the present disclosure have found through comparison that the image contrasts of reconstructed magnetic resonance images corresponding to different filling directions are different. The image contrast of the reconstructed magnetic resonance image corresponding to the filling order of FIG. 2C is superior to that of the linear filling modes of FIGS. 2A and 2B. Moreover, the inventors have found that the echo data in the center of the k space play a decisive role on the image contrast of a reconstructed magnetic resonance image. Thus, an embodiment of the present disclosure proposes a novel k-space filling mode, namely pseudo radial filling, which comprises dividing the k space into a plurality of areas from inside to outside, with the order of acquisition being derived from inside to outside, thereby maximizing the use of the fat saturation effect of quick fat saturation pulses, and filling the echo data with the lowest fat signal into the center of the k space so as to form a k-space effect shown in FIG. 2D.

In order to make the object, technical solutions and advantages of the present disclosure more apparent, the present disclosure will be described in further detail by way of embodiments hereinafter.

Figure 3:
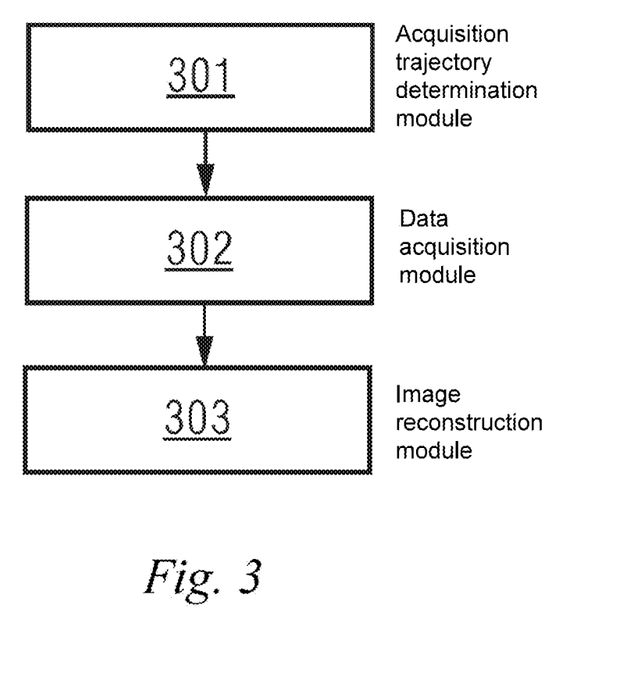
FIG. 3 is an exemplary structural diagram of a magnetic resonance imaging device in an embodiment of the present disclosure.

FIG. 3 is a schematic structural diagram of a magnetic resonance imaging device in an embodiment of the present disclosure. As shown in FIG. 3, the device may include: an acquisition trajectory determination module 301, a data acquisition module 302, and an image reconstruction module 303.

The acquisition trajectory determination module 301 is configured to determine an acquisition trajectory of echo signals in a k space in a manner of filling echo data in a pseudo radial order.

Figure 4A:
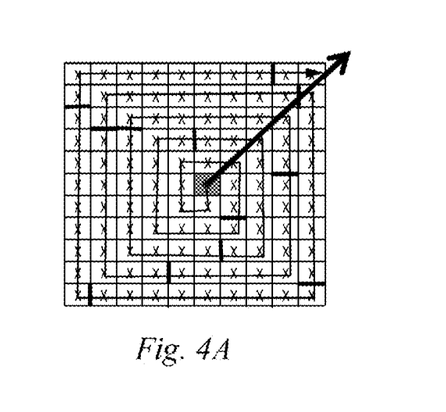
FIGS. 4A to 4C show schematic diagrams of k-space filling in an embodiment of the present disclosure.
Figure 4B:
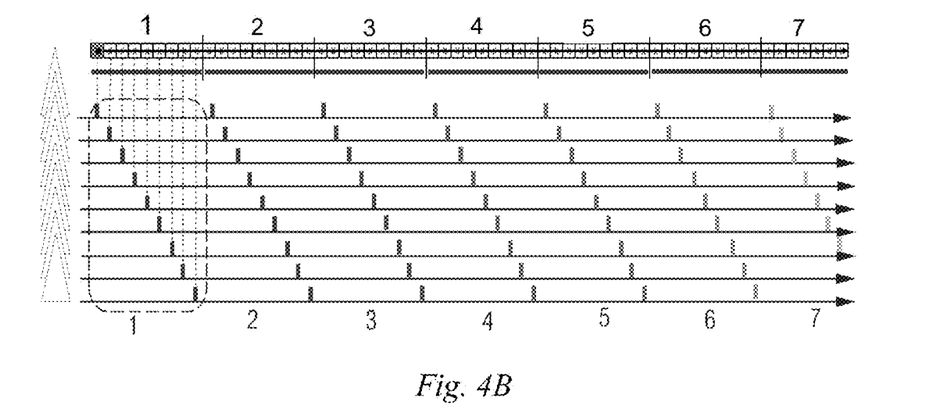
Figure 4C:
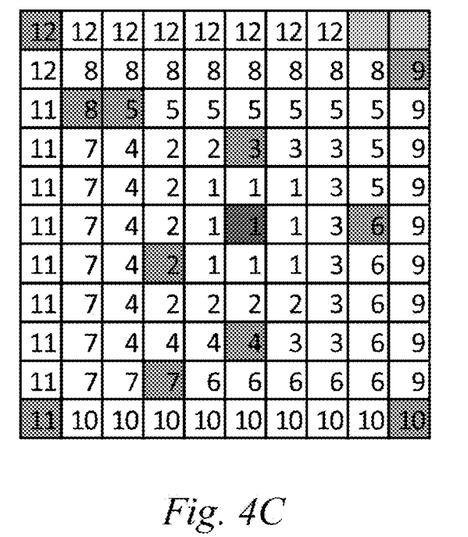

During specific implementation, the acquisition trajectory determination module 301 may be implemented by multiple ways. For example, FIGS. 4A to 4C show one of specific implementation processes. As shown in FIG. 4A, the k space may be first divided into N segments from a center origin in a spiral outward direction according to the number N of excitation pulse trains applied after each fat saturation pulse. For the convenience of understanding, the segments in FIG. 4A are indicated by thick lines. N is a positive integer. Because the space on the paper is limited, for the convenience of expression, the case where N is 12 is taken as an example in this embodiment, and the case where each segment involves 9 acquisitions is taken as an example. For the convenience of description, in the embodiment of the present disclosure, the k space in FIG. 4A is further stretched in a spiral direction into a straight line as shown above in FIG. 4B; and due to the limited space on the paper, FIG. 4B only shows 6 complete segments and 1 incomplete segment, but does not show the other 5 segments. "First", "second", "third", etc. indicate the serial numbers of segments from the center to the spiral outside in sequence, and "1", "2", "3", etc. indicate the serial numbers of a group of echo data acquired in sequence after a fat saturation pulse. As shown in FIG. 4B, after the k space is segmented, the acquisition trajectory of echo signals in the k space may be determined according to the order of filling N pieces of echo data acquired sequentially corresponding to the excitation pulse trains after each fat saturation pulse into a corresponding position in each of the N segments in sequence. That is, for 12 pieces of echo data acquired sequentially after the first fat saturation pulse, the first piece of echo data, that is, the piece of echo data with the lowest fat signal is filled into the first segment, that is, the central area numbered by 1 in FIG. 4C; the second piece of echo data, that is, the piece of echo data with the second lowest fat signal is filled into the second segment, that is, the sub-central area numbered by 2 in FIG. 4C; the third piece of echo data, that is, the piece of echo data with the third lowest fat signal is filled into the third segment, that is, the outward diffracted area numbered by 3 in FIG. 4C; and so on, until the fourth piece of echo data, that is, the piece of echo data with the highest fat signal is filled into the 12th segment, that is, the outermost area numbered by 12 in FIG. 4C. The 12 pieces of echo data acquired sequentially after the second fat saturation pulse are also filled into a position in the 12 segments which is near the positions of the 12 pieces of echo data acquired sequentially after the first fat saturation pulse. And so on, until the k space is fully filled.

It can be seen that, in the embodiment of the present disclosure, the order of acquisition in this filling mode always expands outwards from the center, like but not the same as traditional radial scanning, and therefore is called pseudo radial scanning. In real 3D imaging, when the number of phase encoding steps is more than 100, the order of acquisition looks more radial in a PE plan view.

The data acquisition module 302 is configured to acquire k-space data conforming to the acquisition trajectory and fill the k space.

During specific implementation, the data acquisition module 302 may acquire the data based on a fully-sampled magnetic resonance imaging system, or based on an under-sampled magnetic resonance imaging system. For example, the data acquisition module 302 may acquire, based on a parallel imaging magnetic resonance imaging system, the k-space data conforming to the acquisition trajectory and fill the k space.

The image reconstruction module 303 is configured to reconstruct a magnetic resonance image by using the data in the k space.

The k-space data acquisition device in an embodiment of the present disclosure may include the acquisition trajectory determination module 301 and the data acquisition module 302 described above.

A device embodiment in the embodiments of the present disclosure is described in detail above, and a method embodiment in the embodiments of the present disclosure will be described in detail below. For details not disclosed in the method embodiment of the present disclosure, reference may be made to the corresponding description in the device embodiment of the present disclosure, and the details are not described herein again.

Figure 5:
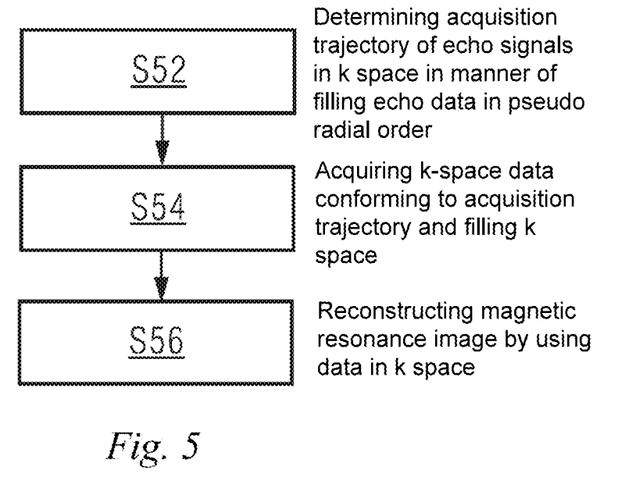
FIG. 5 is an exemplary flowchart of a magnetic resonance imaging method in an embodiment of the present disclosure.

FIG. 5 is an exemplary flowchart of a magnetic resonance imaging method in an embodiment of the present disclosure. As shown in FIG. 5, the method may include the following steps:

S52, determining an acquisition trajectory of echo signals in a k space in a manner of filling echo data in a pseudo radial order.

During specific implementation, in this step, the k space may be divided into N segments from a center origin in a spiral outward direction according to the number N of excitation pulse trains applied after each fat saturation pulse, wherein N is a positive integer; and according to the order of filling N pieces of echo data acquired sequentially corresponding to the excitation pulse trains after each fat saturation pulse into a corresponding position in each of the N segments in sequence, the acquisition trajectory of echo signals in the k space may be determined.

S54, acquiring k-space data conforming to the acquisition trajectory and filling the k space.

During specific implementation, in this step, the data may be acquired based on a fully-sampled magnetic resonance imaging system, or based on an under-sampled magnetic resonance imaging system. For example, in this step, the k-space data conforming to the acquisition trajectory may be acquired based on a parallel imaging magnetic resonance imaging system, and the k space is filled.

S56, reconstructing a magnetic resonance image by using the data in the k space.

The k-space data acquisition method in an embodiment of the present disclosure may include steps S52 and S54 described above.

The implementation effect of the technical solution in the embodiments of the present disclosure will be verified by an experiment below.

In this experiment, a Siemens 3T magnetic spectrum system (16 Cha) was used for in-vivo experiment, and a 16-channel head/neck coil was used for detection of the head of volunteers. The protocol parameters used are: TE/TR=2.47/6.42 ms, BW=250 Hz, FOV=173×190, Matrix 230×288, slices per slab=56, slice OS=28.6%, voxel=0.7×0.7×1.0 mm, Q-fat sat, lines per shot=60, FA=9.

The following explains the meanings of the above protocol parameters:

TE - - - echo time in milliseconds;
TR - - - repetition time in milliseconds;
BW - - - sampling bandwidth in Hertz;
FOV - - - view window in millimeters;
Matrix - - - size of sampling matrix;
slices per slab - - - number of layer selection direction codes for each imaging block;
voxel - - - voxel size in millimeters;
Q-fat sat - - - quick fat saturation;
Lines per shot - - - number of lines sampled after each fat saturation;
FA - - - flip angle in degrees (°).

Figure 6:
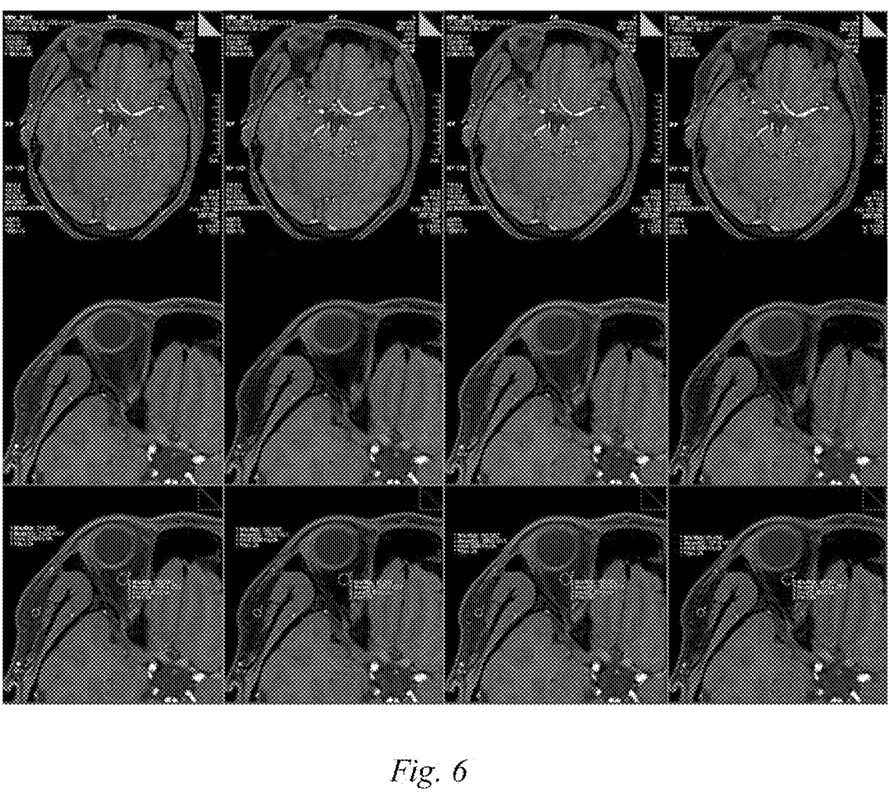
FIG. 6 shows magnetic resonance images of a first volunteer in an embodiment of the present disclosure, wherein the first and third columns are magnetic resonance images obtained by acquisition of k-space data in the pseudo middle order filling mode shown in FIG. 2C, and the second and fourth columns are magnetic resonance images obtained by acquisition of k-space data in the pseudo radial filling mode in the embodiments of the present disclosure.
Figure 7:
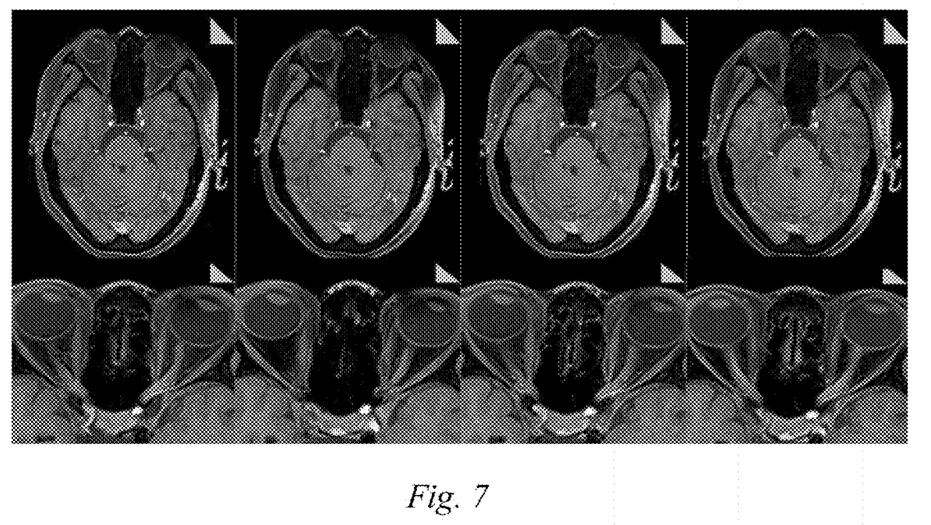
FIG. 7 shows magnetic resonance images of a second volunteer in an embodiment of the present disclosure, wherein the first and third columns are magnetic resonance images obtained by acquisition of k-space data in the pseudo middle order filling mode shown in FIG. 2C, and the second and fourth columns are magnetic resonance images obtained by acquisition of k-space data in the pseudo radial filling mode in the embodiments of the present disclosure.

FIG. 6 shows magnetic resonance images of a first volunteer, wherein the first and third columns are magnetic resonance images obtained by acquisition of k-space data in the pseudo middle order filling mode shown in FIG. 2C, and the second and fourth columns are magnetic resonance images obtained by acquisition of k-space data in the pseudo radial filling mode in the embodiments of the present disclosure. FIG. 7 shows magnetic resonance images of a second volunteer (Note: the volunteer is 60 years old, and there are some movements during a scanning process, causing some slight differences in the slices). Similarly, the first and third columns are magnetic resonance images obtained by acquisition of k-space data in the pseudo middle order filling mode shown in FIG. 2C, and the second and fourth columns are magnetic resonance images obtained by acquisition of k-space data in the pseudo radial filling mode in the embodiments of the present disclosure.

By comparing the magnetic resonance images in different sorting modes in FIGS. 6 and 7, it can be found that under the same parameter setting, the acquisition of k-space data in the pseudo radial order filling mode has a better fat signal suppression effect than the acquisition of k-space data in the pseudo middle order filling mode, thereby further suppressing the fat signal in the k-space center data, and making the visual nerves in the reconstructed image more prominent and clearer.

Figure 8:
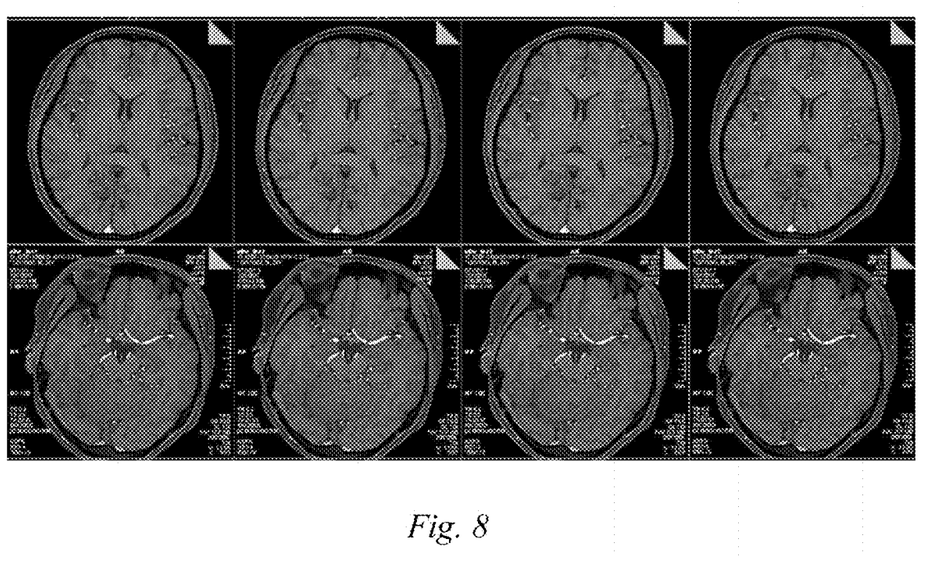
FIG. 8 shows magnetic resonance images of k-space data acquisition by combining parallel imaging with the pseudo radial order filling mode in an embodiment of the present disclosure, wherein the first and third columns are magnetic resonance images obtained by acquisition of k-space data in the pseudo middle order filling mode shown in FIG. 2C, and the second and fourth columns are magnetic resonance images obtained by acquisition of k-space data in the combination of the pseudo radial filling mode and parallel imaging in the embodiment of the present disclosure.

Further, the case where k-space data is acquired by combing parallel imaging with the pseudo radial order filling is tested in an embodiment of the present disclosure. As shown in FIG. 8, also in the above test environment, the first and third columns are magnetic resonance images obtained by acquisition of k-space data in the pseudo middle order filling mode shown in FIG. 2C, and the second and fourth columns are magnetic resonance images obtained by acquisition of k-space data in the combination of the pseudo radial filling mode and parallel imaging in the embodiment of the present disclosure, that is, magnetic resonance images obtained by acquisition of k-space data in the pseudo radial order filling mode based on a parallel imaging magnetic resonance system. It can be seen that the research on the potential negative effect of the acquisition of k-space data in the pseudo radial order filling mode based on the parallel imaging magnetic resonance system shows that no significant negative effect is found when the pseudo radial order filling mode is combined with parallel imaging.

It can be seen from the above solution that the pseudo radial order filling mode is used in the embodiment of the present disclosure to acquire k-space data, so that the echo data with the lowest fat signal are in the central area that can play a key role in image contrast, thereby improving the suppression effect of fat signals without increasing fat saturation pulses, and then improving the image contrast.

In addition, the k space is divided into N segments from the center origin in the spiral outward direction according to the number N of excitation pulse trains applied after each fat saturation pulse, and according to the order of filling N pieces of echo data acquired sequentially corresponding to the excitation pulse trains into a corresponding position in each of the N segments in sequence, the acquisition trajectory of echo signals in the k space is determined, so that the acquisition of k-space data in the pseudo radial filling mode is simple and easier to implement.

Further, the filling in the pseudo radial order can also be combined with parallel imaging for acquisition of k-space data, without producing significant negative effects on the image.

The above description contains only the preferred embodiments of the present disclosure and is not intended to limit the present disclosure. Any modifications, equivalent substitutions, improvements, etc. made within the spirit and principles of the present disclosure should be included within the scope of protection of the present disclosure.

The invention claimed is:

1. A k-space data acquisition device, comprising:
an acquisition trajectory determiner configured to divide a k space into N segments from a center origin in a spiral outward direction according to the number N of excitation pulse trains applied after each fat saturation pulse, and determine, according to the order of filling N pieces of echo data acquired sequentially corresponding to the excitation pulse trains after each fat saturation pulse into a corresponding position in each of the N segments in sequence, an acquisition trajectory of echo signals in the k space, wherein N is a positive integer; and
a data acquirer configured to acquire k-space data conforming to the acquisition trajectory and fill the k space.

2. The k-space data acquisition device according to claim 1, wherein the data acquirer is configured to acquire, based on a parallel imaging magnetic resonance imaging system, the k-space data conforming to the acquisition trajectory and fills the k space.

3. A magnetic resonance imaging device, comprising:
the k-space data acquisition device according to claim 1; and
an image reconstructer configured to reconstruct a magnetic resonance image by using the data in the k space.

4. A k-space data acquisition method, comprising:
dividing a k space into N segments from a center origin in a spiral outward direction according to the number N of excitation pulse trains applied after each fat saturation pulse, wherein N is a positive integer;
determining, according to the order of filling N pieces of echo data acquired sequentially corresponding to the excitation pulse trains after each fat saturation pulse into a corresponding position in each of the N segments in sequence, an acquisition trajectory of echo signals in the k space; and acquiring k-space data conforming to the acquisition trajectory and filling the k space.

5. The k-space data acquisition method according to claim 4, wherein said acquiring k-space data conforming to the acquisition trajectory and filling the k space comprises:

acquiring, based on a parallel imaging magnetic resonance imaging system, the k-space data conforming to the acquisition trajectory and filling the k space.

6. A magnetic resonance imaging method, comprising:

dividing a k space into N segments from a center origin in a spiral outward direction according to the number N of excitation pulse trains applied after each fat saturation pulse, wherein N is a positive integer;

determining, according to the order of filling N pieces of echo data acquired sequentially corresponding to the excitation pulse trains after each fat saturation pulse into a corresponding position in each of the N segments in sequence, an acquisition trajectory of echo signals in the k space;

acquiring k-space data conforming to the acquisition trajectory and filling the k space; and reconstructing a magnetic resonance image by using the data in the k space.

7. The magnetic resonance imaging method according to claim 6, wherein said acquiring k-space data conforming to the acquisition trajectory and filling the k space comprises:

acquiring, based on a parallel imaging magnetic resonance imaging system, the k-space data conforming to the acquisition trajectory and filling the k space.

* * * * *